United States Patent
Koelling (10) Patent No.: US 6,259,280 B1
(45) Date of Patent: Jul. 10, 2001

(54) CLASS AB AMPLIFIER FOR USE IN SEMICONDUCTOR MEMORY DEVICES

(75) Inventor: Jeffrey E. Koelling, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/160,844

(22) Filed: Sep. 25, 1998

Related U.S. Application Data (60) Provisional application No. 60/059,657, filed on Sep. 25, 1997.

(51) Int. Cl.[7] .................................................. G01R 19/00
(52) U.S. Cl. ................................ 327/53; 327/54; 327/56; 330/253; 330/255
(58) Field of Search .................................... 327/50, 51, 52, 327/53, 54, 55, 56, 63, 65, 66, 67, 69, 70; 330/253, 255, 257

(56) References Cited

U.S. PATENT DOCUMENTS

| | | | |
|---|---|---|---|
| 4,110,641 | * 8/1978 | Payne ........................................ | 327/67 |
| 4,806,791 | * 2/1989 | Mizuide ..................................... | 327/66 |
| 5,077,489 | * 12/1991 | Gola et al. ................................. | 327/77 |
| 5,442,320 | * 8/1995 | Kunst et al. ............................. | 330/267 |
| 5,504,458 | * 4/1996 | Van Brunt et al. ..................... | 330/255 |
| 5,585,747 | * 12/1996 | Proebsting ................................ | 327/55 |

* cited by examiner

Primary Examiner—Timothy P. Callahan
Assistant Examiner—Hai L. Nguyen
(74) Attorney, Agent, or Firm—Dwight N. Holmbo; Wade James Brady III; Frederick J. Telecky Jr.

(57) ABSTRACT

A class AB amplifier (400) is disclosed, having a first input node (402), a second input node (404), and an output node (406). A push-pull input stage (412) includes cross-coupled pairs of transistors, which form a charge current path and a discharge current path. When the voltage at the first input node (402) is greater than the voltage at the second input node (406), the amount of current drawn in the charge current path increases, and the amount of current drawn in the discharge current path decreases. When the voltage at the first input node (402) is less than the voltage at the second input node (404), the amount of current in the charge current path decreases while the amount of current in the discharge path increases. A first and fourth current mirror (422 and 428) are coupled to the charge current path, and a second and third current mirror (424 and 426) are coupled to the discharge current path. In response to increases in the amount of current drawn in the charge current path, the first current mirror (422) drives a discharge node (432) to a charge voltage, and the fourth current mirror (428) drives a charge node (434) to a charge voltage. In response to increases in the amount of current drawn in the discharge current path, the second current mirror (424) drives the discharge node (432) to discharge voltage, and the third current mirror (426) drives the charge node (434) to a discharge voltage. An output driver (430) charges the output node (406) when the charge node (434) is at the charge voltage, and discharges the output node (406) when the discharge node (432) is at the discharge voltage.

24 Claims, 4 Drawing Sheets

CLASS AB AMPLIFIER FOR USE IN SEMICONDUCTOR MEMORY DEVICES

This application claims priority under 35 USC § 119(e)(1) of provisional application number 60/059,657filed Sep. 25, 1997.

TECHNICAL FIELD

The present invention relates generally to semiconductor devices, and more particularly to amplifier circuits for use in semiconductor memory devices.

BACKGROUND OF THE INVENTION

An important aspect of an integrated circuit (IC) is the amount of current that the IC draws when in use. The amount of current drawn is directly related to the power consumption of the IC, and so it is desirable to reduce current consumption whenever possible. The current drawn by an IC can include "active" current, consumed when active devices, such as transistors, within the IC are undergoing current or voltage switching operations, and "stand-by" current, consumed when the active devices within the IC are in a quiescent state.

In the case of dynamic random access memories (DRAMs), certain internal circuits can consume considerable amounts of stand-by current; for example, bit line reference (BLR) driver circuits and plate voltage (PLT) driver circuits. A BLR driver circuit provides a BLR voltage to a BLR node. During a read operation, sense amplifiers within the DRAM compare the voltage at the BLR node to voltages on the bit lines to generate a data output signal. The BLR circuit can be an amplifier having the positive input tied to a reference BLR voltage, and the negative input tied to the BLR node. The output of the amplifier is also coupled to the negative input aid the BLR node. In the event the voltage at the BLR node begins to drop below the BLR voltage, the BLR circuit charges the reference node back up to the BLR voltage.

The PLT driver within a DRAM provides a "plate" voltage to a portion, or all, of the storage capacitors within the DRAM array. The plate voltage may vary according to operating mode of the DRAM. For example, in an active mode, the plate voltage may be some voltage intermediate a logic high and logic low voltage, while in an stand-by mode, the plate voltage may be the low power supply voltage. The PLT driver may also be an amplifier circuit having a negative input coupled to a plate node, a positive input coupled to a reference PLT voltage and an output also coupled to the plate node and the negative input. In the event the plate voltage varies from the desired plate voltage, the PLT driver will charge or discharge the plate node and thus return it to the desired plate voltage.

Figure 1:
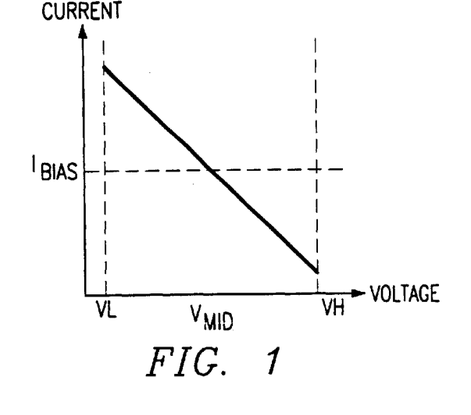
FIG. 1 is a graph illustrating the current-to-input voltage relationship of one type of class A amplifier.

The reason that BLR driver and PLT drivers can consume considerable stand-by current is that such circuits are typically "class A" mode amplifier circuits. Class A mode amplifiers include output drivers that are biased to draw a relatively high current in a quiescent state. One example of the input voltage current response of a class A amplifier is set forth in FIG. 1. The current drawn reaches a high level at a lowest input voltage (VL), and a low level at the highest input voltage (VH). Notably, at the intermediate voltage level (Vmid), the bias current (Ibias) is drawn. Thus, in the event a DRAM is in a stand-by mode, those circuits having a class A mode amplifier configuration will continuously draw a relatively high current, contributing to the overall stand-by current.

A number of approaches have been taken to reduce stand-by current of class A amplifier circuits within a DRAM. A first approach involves utilizing weaker class A amplifier circuits. The biasing current can be reduced, with a corresponding reduction in the size of the output driver devices. A drawback to such an approach is that when an amplifier output node potential varies (a BLR node or PLT node, for example) due to the reduced size of the devices making up the amplifier, it may take too much time to charge or discharge the output node back up to, or down to, the desired reference voltage (the BLR voltage or PLT voltage, for example).

Another approach to reducing the current consumption of DRAM BLR circuits and PLT circuits, is to employ two different circuits, one for stand-by operation and one for active operation. The active devices within the stand-by circuits can be comparatively small, as they would have to account for variations in their outputs that result from leakage, or other such parasitic effects. The devices within the active circuits can be much larger, providing rapid response for the DRAM in the active mode, ensuring any variations in output nodes are quickly compensated for. A drawback to using an active and stand-by circuit is the additional amount of area required for such a solution. Further logic circuits and control lines must be created to turn the circuits on and off depending upon the mode (stand-by or active).

Another type of class A type amplifier circuit is the high-speed input buffers used in some DRAMs. High-speed input buffers receive externally applied signals on a bus line, and amplify (buffer) them for use within the DRAM. After the input signal has been detected, the bus line might be returned to a voltage level intermediate a logic high and logic low level. When the input buffers are class A type circuits, as in the case of the BLR and PLT circuits described above, the input buffers will draw relatively large amounts of current when the bus lines are idle, further contributing to additional stand-by current.

It would be desirable to provide an alternative approach to such class A circuits as the bit line reference circuit, plate voltage circuit, and high speed input buffer circuit described above.

SUMMARY OF THE INVENTION

The preferred embodiment is a novel class AB amplifier having a first input node, a second input node, and an output node. In the preferred embodiment, the output node is fed back to the second input node. A push-pull input stage receives an input voltage between the first and second input nodes directly and by way of first and second level shifters. In response to the input voltage, the push-pull input stage increases a charging reference current through a first and fourth leg of the input stage, while decreasing a discharging reference current through a second and third leg of the input stage, or vice versa. A current mirror is coupled to each leg of the input stage, providing a first stage of amplification. The four current mirrors drive a final output stage. The preferred embodiment amplifier provides a rapid response to changes in output loads (active operation), while at the same time, draws a relatively small amount of current in the quiescent state (stand-by operation).

According to one aspect of the present invention, the input stage of the class AB amplifier includes a first pair of transistors of a first conductivity type, cross-coupled with a second pair of transistors of a second conductivity type.

According to another aspect of the present invention, the current mirrors coupled to the first and second legs of the push-pull input stage are composed of transistors of a first conductivity type, and the current mirrors coupled to the third and fourth legs are composed of transistors of a second conductivity type.

According to another aspect of the present invention, the novel class AB amplifier is a voltage regulator that receives a reference voltage at the first input node, and regulates the voltage at the output node by amplifying any variations between the output node voltage and the reference voltage. The voltage regulator may be used in a DRAM to provide a bit line reference voltage. The voltage regulator may also be used to provide a plate reference voltage, used to establish a voltage common to a number of storage capacitors in a memory cell array.

According to another aspect of the present invention, the novel class AB amplifier is employed as a high speed input buffer. In the presence of input data at a logic high or logic low level, the amplifier rapidly drives an output node. In the absence of input data, the amplifier enters a low current quiescent state, in which the input nodes return to a voltage level intermediate the logic high and logic low level.

An advantage of the present invention is that it may be used as a voltage regulating circuit for both active and stand-by modes, as the novel class AB amplifier provides strong driving capability, while at the same time, draws low current in a quiescent state.

DETAILED DESCRIPTION OF THE EMBODIMENTS

Figure 2:
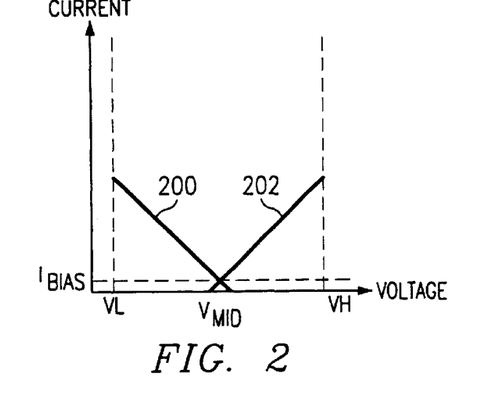
FIG. 2 is a graph illustrating the current-to-input voltage relationship of one type of class AB amplifier.

The preferred embodiment is a novel class AB type amplifier. Accordingly a brief description of a prior art class AB amplifier will be presented. Referring now to FIG. 2, the input voltage-current response of one prior art class AB amplifier is set forth in a graph. Class AB amplifiers typically rely on a pull-up circuit and a pull-down circuit for providing the output signal, and so have a lower biasing current. The current drawn by the pull-down device is shown as item 200. The current drawn by the pull-up device is shown as item 202. As shown in FIG. 2, when the input voltage is at a lowest level (VL), the pull-down circuit (or pull-up circuit in the case of an inverting class AB amplifier) is turned on strongly, and supplies the current necessary to drive the output. Conversely, when the input voltage is at a highest level (VH), the pull-up circuit (or pull-down circuit in inverting case) is turned on strongly, providing the necessary discharge path for the output. Advantageously, the class AB circuit can be biased at some intermediate voltage (Vmid), where both the pull-up and pull-down circuits are only turned on weakly, drawing a relatively small amount of stand-by current.

Figure 3:
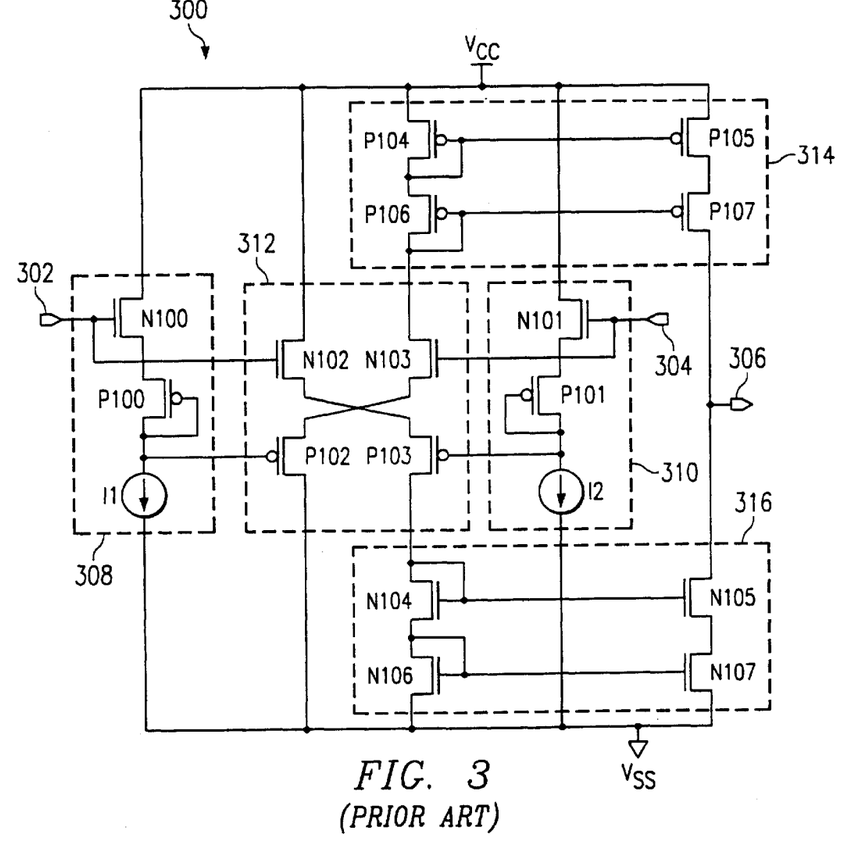
FIG. 3 is a schematic diagram illustrating a prior art class AB amplifier.

A prior art class AB amplifier is set forth in FIG. 3 as item 300. The class AB amplifier 300 receives a differential voltage between a first input node 302 and a second input node 304, and in response to the differential voltage, drives an output node 306. The amplifier 300 is shown to include a first level shifter 308, a second level shifter 310, a push-pull input stage 312, charging current mirror 314, and a discharging current mirror 316.

The first level shifter 308 includes an n-channel metal-oxide-semiconductor (MOS) input transistor N100, having a drain coupled to a positive power supply Vcc, a gate coupled to the first input node 302, and a source coupled to the source of a p-channel MOS transistor P100. Transistor P100 is connected in a diode configuration, having its gate coupled to its drain. A first current source I1 is situated between the gate/drain of transistor P100 and a low power supply voltage Vss. In a similar fashion, the second level shifter 310, is coupled to the second input node 304, and includes an n-channel MOS input transistor N101, a diode connected p-channel MOS transistor P101, and a second current source I2.

The push-pull input stage 312 includes two n-channel MOS transistors N102 and N103, and two p-channel MOS transistors P102 and P103. Transistor N102 has a drain coupled to the Vcc power supply, a gate coupled to the first input node 302, and a source coupled to the source of transistor P103. Transistor P103 has a gate coupled to the second level shifter 310, and a drain coupled to the discharging current mirror 316. The source-drain paths of transistors N102 and P103 provide a discharge reference current path. Transistors P102 has a drain coupled to the Vss power supply, a gate coupled to the first level shifter 308, and a source coupled to the source of transistor N103. The gate of transistor N103 is coupled to the second input node 304, and has a drain coupled to the charging current mirror 314. The source-drain paths of transistors N103 and P102 provide a charging reference current path.

The charging and discharging current mirrors (314 and 316) are both arranged in a cascode configuration, with the charging current mirror 314 being composed of p-channel MOS transistors P104–P107. Current running through the source-drain paths of transistors P104 and P106 is mirrored in the source-drain paths of transistors P105 and P107. The discharging current mirror 316 is also arranged in a cascode configuration, and includes n-channel MOS transistors N104–N107. In the same general manner as the charging current mirror 314, current pulled through the source-drain paths of transistors N104 and N106 is mirrored in the source-drain paths of transistors N105 and N107.

In the quiescent state, first and second current sources I1 and I2 draw a (relatively low) stand-by current. This stand-by current is mirrored in the source-drain paths of transistors P102 and N103 and transistors P104 and P106 of the charging current mirror 314. Consequently, the current drawn by transistors P104 and P106 is mirrored by transistors P105 and P107, generating a quiescent output driver current. In the same fashion, the second current source I2, by operation of transistors P101, N102 and P103, and N104 and N106, results in a quiescent current being pulled by transistors N105 and N107.

When the first input node 302 is driven to a higher voltage than the second input node 304, the amplifier 300 discharges the output node 306. Transistor N102 begins to turn on more strongly, and more current begins to be drawn through the source-drain paths of the transistors N102, P103, N104 and N106 (the discharge reference current path). The current in the discharge reference path is mirrored by transistors N105 and N107, and more current is drawn from the output node 306 to the low power supply Vss (i.e., the output is discharged). At the same time, the high input voltage at the first input node 302 results in the gate of transistor P102 being pulled higher by operation of first level shifter 308. Transistor P102 thus begins to conduct less current and the voltage at its source begins to rise, turning off transistor N103. The decrease in current drawn through the source-drain path of transistors P104, P106, N103 and P102 (the charging reference current path) is mirrored by transistors P105 and P107, and less and less current is provided to the output node 302 from the positive power supply Vcc.

When the first input node 302 is driven to a lower voltage than the second input node 304, the amplifier 300 charges the output node 306. The low voltage at the gate of transistor N102 begins to turn the transistor off, and less current begins to flow through the discharge reference current path. As a result, less current flows through transistors N105 and N107. At the same time, the voltage at the first input node 302 begins to turn on transistor P102, more strongly. More current flows through the charging reference current path. This current is mirrored by transistors P105 and P107, and the output node 306 begins to charge.

Having described the general operation of a prior art class AB amplifier, the preferred embodiment novel class AB amplifier will now be described in detail.

Figure 4:
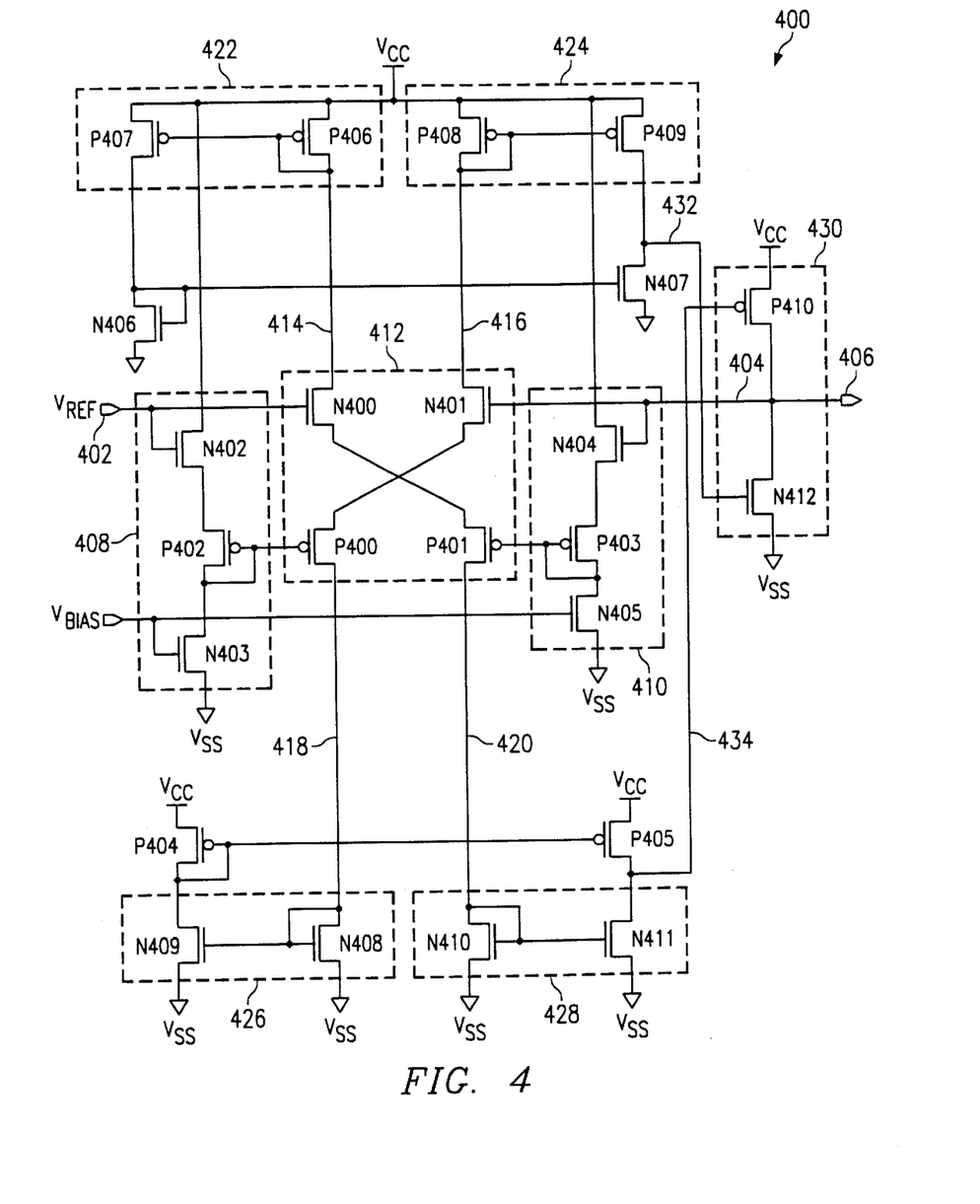
FIG. 4 is a schematic diagram illustrating a preferred embodiment.

The preferred embodiment novel class AB amplifier is set forth in a schematic diagram in FIG. 4, and designated by the general reference character 400. As shown in the figure, the preferred embodiment 400 is realized with complementary MOS (CMOS) technology, and is shown to include a first input node 402, a second input node 404, and an output node 406. The preferred embodiment 400 is configured as a voltage regulator, with the first input node 402 being coupled to a reference voltage Vref, and the second input node 404 being coupled to the output node 406. As the output node 406 varies from a reference potential established by the reference voltage Vref, the amplifier 400 will drive the output node back to the reference voltage. Advantageously, the preferred embodiment 400 draws a low stand-by current.

The preferred embodiment 400 further includes a first level shifter 408, a second level shifter 410, and a push-pull input stage 412. The input stage 412 includes a pair of n-channel MOS transistors, N400 and N401, cross-coupled by their sources to the sources of a pair of p-channel channel MOS transistors P400 and P401. The voltage appearing between the first and second input nodes (402 and 404) is coupled directly to the gates of transistors N400 and N401, respectively. In addition, the voltage at the first input node 402 is coupled to the gate of transistor P400 by way of the first level shifter 408. Similarly, the voltage at the second input node 404 is coupled to the gate of transistor P401 by way of the second level shifter 410.

The first level shifter 408 is shown to include an n-channel MOS input transistor N402. having a drain coupled to the Vcc power supply, a gate coupled to the first input node 402, and a source coupled to the source of p-channel MOS transistor P402. Transistor P402 is diode connected, having its gate coupled to its drain. The drain of transistor P402 provides the input voltage to the gate of transistor P400 within the input stage 412. An n-channel MOS current source transistor N403 has a source-path coupled between the drain of transistor P402 and the Vss power supply. The gate of transistor N403 receives a bias voltage (Vbias) that establishes the quiescent current of the amplifier 400. The second level shifter 410 has the same general configuration as the first level shifter 408, having an n-channel MOS input transistor N404, a p-channel MOS diode connected transistor P403, and current source n-channel MOS transistor N405. The gate of the current source transistor N405 receives the same bias voltage (Vbias) as the transistor N403.

The input stage can be conceptualized as including a four current carrying legs; a first leg 414 corresponding to the drain of transistor N400, a second leg 416, corresponding to the drain of transistor N401, a third leg 418, corresponding to the drain of transistor P400, and a fourth leg 420, corresponding to the drain of transistor P401. A current mirror is provided for each current carrying leg (414–420). A first current mirror 422 is coupled to the first leg 414, a second current mirror 424 is coupled to the second leg 416, a third current mirror 426 is coupled to the third leg 418, and a fourth current mirror 428 is coupled to the fourth leg 420.

The first current mirror 422 is further coupled to a discharge load device N406, which drives discharge disable drive device N407. Similarly, the third current mirror 426 is coupled to a charge load device P404, which drives a charge disable drive device P405.

The first and second current mirrors (422 and 424) are each composed of two p-channel MOS transistors, while the third and fourth current mirrors (426 and 428) are each composed of n-channel MOS transistors. The first current mirror 422 includes a diode connected transistor P406 having a source coupled to the Vcc voltage, and a commonly connected gate/drain that receives a reference current from the first current carrying leg 414. The operation of diode connected transistor P406 is mirrored by transistor P407, which has a source coupled to the Vcc voltage, a gate coupled to the gate/drain of transistor P406, and a drain coupled to gate/drain of discharge load device N406. The remaining current mirrors (424, 426 and 428) are similar to the first current mirror 422, with each having a diode connected transistor (P408, N408 and N410, respectively) and a mirroring transistor (P409, N409 and N411, respectively). Further, each of the current mirrors 424, 426 and 428 receives a reference current from a leg (416, 418 and 420, respectively) of the input stage 412, and drives its mirroring transistors in response thereto. With continued reference to FIG. 4, the first current mirror 424 can include a first reference IGFET and a first output IGFET of a second conductivity type, the first reference IGFET having its source coupled to a first power supply voltage Vcc, its drain coupled to the second current leg 416 of the push-pull input stage 412, and its gate coupled to its drain, and the first output IGFET having its source coupled to the first power supply voltage Vcc, its drain coupled to the discharge node 432, and its gate coupled to the gate of the first reference IGFET. The second current mirror 428 can include a second reference IGFET and a second output IGFET of a first conductivity type, the second reference IGFET having its source coupled to a second power supply voltage Vss, its drain coupled to the fourth current leg 420 of the push-pull input stage 412, and its gate coupled to its drain, and the second output IGFET having its source coupled to the second power supply voltage Vss, its drain coupled to the charge node 434, and its gate coupled to the gate of the second reference IGFET.

An output driver 430 couples the output node 406 (and second input node 404) to a high power supply voltage Vcc, or a low power supply voltage Vss, in response to the potential at a discharge node 432, and a charge node 434. The discharge node 432 is driven by the combination of the discharge disable drive device N407 and the second current mirror 424. The charge node 434 is driven by the combination of charge disable device P405 and the fourth current mirror 428. The preferred embodiment output driver 430 is a CMOS driver having a p-channel MOS pull-up device P410, and an n-channel MOS pull-down device N412. The charge and discharge nodes (434 and 432) control the output driver 430 and can be considered control nodes. With continued reference to FIG. 4, the class AB amplifier 400 can thus be seen to have a push-pull input stage 412 that includes a charge current path coupled between the first and fourth current legs 414, 420 in which the charge current path has a first impedance control device N400 coupled in series with a second impedance control device P401, the first impedance control device N400 being coupled to the first input node 402. The push-pull input stage 412 can be seen to also include a discharge current path coupled between the second and third current legs 416, 418 in which the discharge current path has a third impedance control device N401 coupled in series with a fourth impedance control device P400, the third impedance control device N401 being coupled to the second input node 404. The first impedance control device N400 and third impedance control device N401 can be first and second insulated gate field effect transistors (IGFETs), respectively, in which the gate of the first IGFET is coupled to the first input node 402 and the gate of the second IGFET is coupled to the second input node 404. The first and third impedance control devices N400, N401 can be IGFETs of a first conductivity type, and the second and fourth impedance control devices P400, P401 can be IGFETs of a second conductivity type.

Having described the general components of the preferred embodiment 400 in one manner, an alternate description follows, to further assist in the understanding of the operation of the preferred embodiment.

The novel class AB amplifier 400 of the preferred embodiment may also be conceptualized as having intermediate driver stages and a final driver stage. The final driver stage is the output driver 430. The intermediate driver stages include a first intermediate driver, which drives the discharge node 432 between the supply voltages Vcc and Vss, and a second intermediate driver, which drives the charge node 434 between the supply voltages Vcc and Vss.

The first intermediate driver includes a discharge disable circuit, which pulls the discharge node 432 toward a low voltage, tending to turn off pull-down device N412, and a discharge enable circuit, which pulls the discharge node 432 toward high voltage, tending to turn on pull-down device N412. The discharge disable circuit is composed of the first current mirror 422, discharge disable load device N406, and discharge disable drive device N407. In response to an increase in current through the first current leg 414, transistor N407 will pull the discharge node 432 toward the low power supply voltage, Vss. The discharge enable circuit is composed of the second current mirror 424. In response to an increase in current through the second current leg 416, transistor P409 will pull the discharge node 432 toward the high power supply voltage, Vcc.

The second intermediate driver includes a charge disable circuit, which pulls the charge node 434 toward a high voltage, tending to turn off pull-up device P410, and a charge enable circuit, which pulls the charge node 434 toward a low voltage, tending to turn on pull-up device P410. The charge disable circuit is composed of the third current mirror 426, charge disable load device P404, and discharge disable drive device P405. In response to an increase in current through the third current leg 418, transistor P405 will pull the charge node 434 toward the high power supply voltage, Vcc. The charge enable circuit is composed of the fourth current mirror 428. In response to an increase in current through the fourth current leg 420, transistor N411 will pull the charge node 432 toward the low power supply voltage, Vss.

Thus, the first current leg 414 can be conceptualized as being a discharge disable node. As the current drawn through the first current leg 414 increases, transistor N407 will tend to turn on, pulling the discharge node 432 low. The second current leg 416 can be conceptualized as a discharge enable node. As the current through the second current leg 416 decreases, transistor P409 will begin turning off, allowing the discharge node 432 to be pulled to the supply voltage Vss. It follows, that when the current through the first current leg 414 decreases and the current through the second current leg 416 increases, transistor P409 will begin turning on stronger, while transistor N407 will begin turning off.

Similarly, the third current leg 418 can be conceptualized as being a charge disable node. As the current drawn through the third current leg 418 increases, transistor P405 will tend to turn on stronger, pulling the charge node 434 to a higher potential. The fourth current leg 420 can be conceptualized as a charge enable node. As the current through the fourth current leg 420 decreases, transistor N411 will begin turning off, allowing the charge node 434 to be pulled toward the supply voltage Vcc. It follows, that when the current through the third current leg 418 decreases and the current through the fourth current leg 420 increases, transistor N411 will begin turning on stronger, while transistor P405 will begin turning off.

Figure 5A:
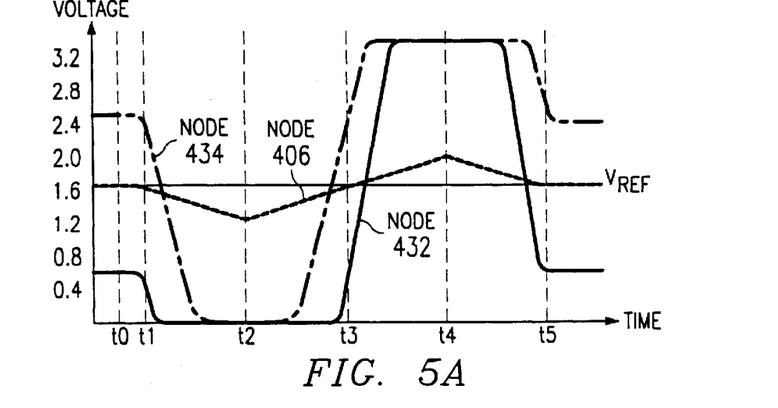
FIGS. 5a and 5b are timing diagrams illustrating the operation of the preferred embodiment set forth in FIG. 4.
Figure 5B:
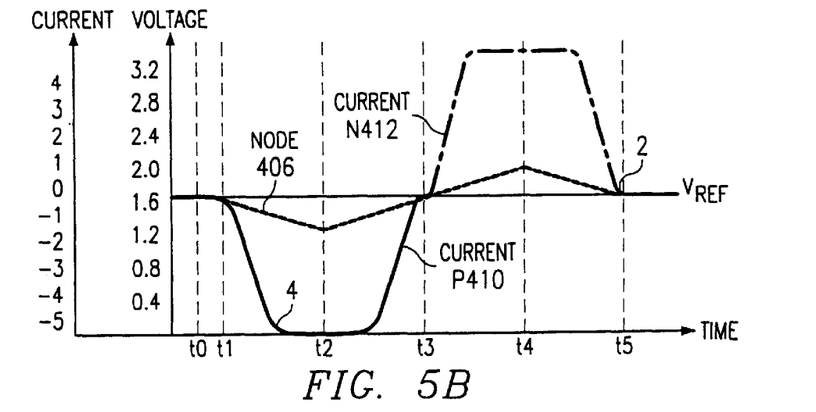

The operation of the novel class AB amplifier 400 is best understood with reference to FIGS. 5a and 5b. FIGS. 5a and 5b are timing diagrams setting forth the response of various voltages and currents within the amplifier 400 in response to a fall and a rise in the voltage at the output node 406. FIG. 5A illustrates the reference voltage Vref at the first input node 402 (which remains constant), the voltage at the discharge node 432 (which drives the pull-down device N412 in the output driver 430), and the voltage at the charge node 434 (which drives the pull-up device P410 in the output driver 430). FIG. 5B also illustrates the output node voltage 406 and reference voltage, but in addition, sets forth the amount of current flowing through pull-up device P410 and pull-down device N412 in response to the variations in the voltage at output node 406.

Referring now to FIG. 4 in conjunction FIGS. 5a and 5b, the operation of the novel class AB amplifier 400 will be described. For the purposes of this description it is assumed that a constant voltage Vref is supplied to the first input node 402, and the voltage at the output node 406 may vary in response to changes in the output load.

At time t0, the voltage at output node 406 (and the second input node 404) is equivalent to the reference voltage Vref at the first input node 402, and the amplifier 400 is in a balanced (quiescent) state. The quiescent current drawn by the amplifier 400 is determined by the first and second level shifters (408 and 410). According to the bias voltage Vbias applied to the gates of current source transistors N403 and N405, and the sizes of the transistors (N403 and N405), a bias current will be drawn along the source-drain paths of the transistors within the first level shifter 408 (N402, P402 and N403), and along the source-drain paths of the transistors within the second level shifter (N404, P403 and N405). The current running through the first level shifter 408 is mirrored along a discharge current path created by the source-drain paths of transistors P408-N401-P400-N408. Similarly, the current drawn through the second level shifter 410 is mirrored in a charge current path created by the source-drain paths of transistors P406-N401-P401-N410. The current running within the discharge and charge current paths are mirrored in the four current mirrors (422, 424, 426 and 428), and, in conjunction with transistors N406, N407 and P404 and P405, establish a quiescent voltage at the discharge and charge nodes (432 and 434). In the preferred embodiment, the voltage at the charge node 434 is approximately Vcc−Vtp, where Vtp is the threshold voltage of pull-up device P410. The voltage at the discharge node 432 is approximately Vss+Vtn, where Vtn is the threshold voltage of pull-down device N412. This bias condition results in a relatively small amount of current being drawn by the output driver 430 in the quiescent state.

At time t1, the voltage at output node 406 (and consequently the second input node 404) begins to fall lower than the reference voltage Vref. Transistors N401 within the input stage 412 begin turning off, and the voltage at the drain/gate of transistor P408 begins to rise in potential, and transistor P409 begins turning off. At the same time, transistor N404 within the second level shifter 410 begins to turn off, and the potential at the drain/gate of transistor P403 begins to fall, and transistor P401 begins turning on stronger. The drain/gate of transistor P406 begins to fall in potential, and transistor P407 begins to turn on stronger, pulling the gate of transistor N407 to a higher potential. Transistor N407 begins turning on stronger. With transistor N407 turning on stronger, and transistor P409 turning off, the discharge node 432 begins to fall in potential. In this manner, as the output node 406 begins to fall in potential, the pull-down device N412 within the output driver 430, begins turning off, to prevent the pull-down device N412 from providing a discharge path between the Vss supply voltage and the output node 406.

At the same time, with transistor N401 turning off, the potential at the gate/drain of transistor N408 begins to fall, and transistor N409 begins to turn off. The gate/drain of transistor P404 begins to rise, and transistor P405 begins to turn off. Conversely, with transistor P401 turning on stronger, the gate/drain of transistor N410 is pulled higher, and transistor N411 begins to turn on stronger. With transistor N411 turning on stronger, and transistor P405 turning off, the charge node 434 begins to fall in potential, and pull-up device P410 turns on stronger. In this manner, as the output node 406 begins to fall in potential, the pull-up device P410 within the output driver 430, begins turning on stronger, to counteract the voltage drop, and bring the output node 406 back up to the Vref potential.

Between times t1 and t2, the voltage at the output node 406 continues to drop, and the devices within the amplifier 400 operate as described for time t1, with devices continuing to turn off, and turn on harder. As a result, as set forth in FIG. 5A, the voltage at the discharge node 432 and charge node 434 continues to fall, with the discharge node 432 being pulled essentially to the supply voltage Vss. As set forth in FIG. 5B, the pull-up device P410 will draw more and more current, as the voltage at the output node 406 continues to fall.

At time t2, the voltage at the output node 406 is at a low point, which has resulted in the saturation of the pull-up device P410 in the output driver 430. The charge node 434 is essentially at the supply voltage Vss, and a maximum amount of current is flowing from the supply voltage Vcc to the output node 406.

Between times t2 and t3, the voltage at the output node 406, is shown rising back up to the reference voltage Vref. The devices within the amplifier 400 that were turning on stronger between times t1 and t2, begin turning on weaker, while those devices that were turning off, begin to turn back on. As a result, the voltage at charge node 434, begins to climb from the voltage Vss, and the pull-up device P410 begins to conduct less and less current.

Just prior to time t3, the output voltage 406 returns to the reference voltage Vref, and the discharge node 432 is at approximately Vss+Vtn, and the charge node 434 is at approximately Vcc−Vtp. The amplifier 400 draws a quiescent current, established by the bias voltage Vbias and current source devices N403 and N405, as previously described.

At time t3, the voltage at output node 406 (and consequently the second input node 404) begins to rise above the reference voltage Vref. Transistor N401 within the input stage 412 begins turning on stronger, and the voltage at the drain/gate of transistor P408 begins to fall in potential, and transistor P409 begins turning on stronger. Transistor N404 within the second level shifter 410 begins to turn on stronger and the potential at the drain/gate of transistor P403 begins to rise, and transistor P401 begins turning off. The drain/gate of transistor P406 begins to rise in potential and transistor P407 begins to turn off. The gate of transistor N407 begins falling in potential, and transistor N407 begins turning off. With transistor N407 turning off and transistor P409 turning on stronger, the discharge node 432 begins to rise in potential. In this manner, as the output node 406 begins to rise in potential, the pull-down device N412 within the output driver 430 begins turning on stronger, counteracting the rise in the potential at the output node 406 in order to bring the output node 406 back down to the Vref potential.

At the same time, with transistor N401 turning on, the potential at the gate/drain of transistor N408 begins to rise, and transistor N409 begins to turn on stronger. The gate/drain of transistor P404 begins to fall, and transistor P405 begins to turn on stronger. Conversely, with transistor P401 beginning to turn off, the gate/drain of transistor N410 begins to fall, and transistor N411 begins to turn off. With transistor N411 turning off, and transistor P405 turning on, the charge node 434 begins to rise in potential, and pull-up device P410 begins turning off. In this manner, as the output node 406 begins to rise in potential, the pull-up device P410 within the output driver 430 begins turning off, to prevent the pull-up device P410 from providing a charge path from the Vcc supply voltage to the output node 406. Between times t3 and t4, the voltage at the output node 460 continues to rise, and the devices within the amplifier 400 operate as described for time t3, with devices continuing to turn off, and turn on harder. As a result, as set forth in FIG. 5A, the voltage at the discharge node 432 and charge node 434 continues to rise, with the discharge node 432 being pulled essentially to the supply voltage Vcc. As set forth in FIG. 5B, the pull-down device N412 will draw more and more current as the voltage at the output node 406 continues to rise.

At time t4, the voltage at the output node 406 is at a high point, which has resulted in the saturation of the pull-down device N412 in the output driver 430. The discharge node 432 is essentially at the supply voltage Vcc, and a maximum amount of current is flowing from the output node 406 to the supply voltage Vss.

Between times t4 and t5, the voltage at the output node 406, is shown falling back down to the reference voltage Vref. The devices within the amplifier 400 that were turning on stronger between times t3 and t4, begin turning on weaker, while those devices that were turning off, begin turning back on. As a result, the voltage at discharge node 432 begins to fall from the voltage Vcc and the pull-down device N412 begins to conduct less and less current.

After time t5, the output voltage 406 returns once again to the reference voltage Vref, and the amplifier 400 is in the quiescent state.

The preferred embodiment amplifier 400 thus provides rapid response to differential voltages at its input nodes (402 and 404) while also providing a low current quiescent state. The preferred embodiment may be employed in various integrated circuit applications. One of these many applications is set forth in FIGS. 6 and 7.

Figure 6:
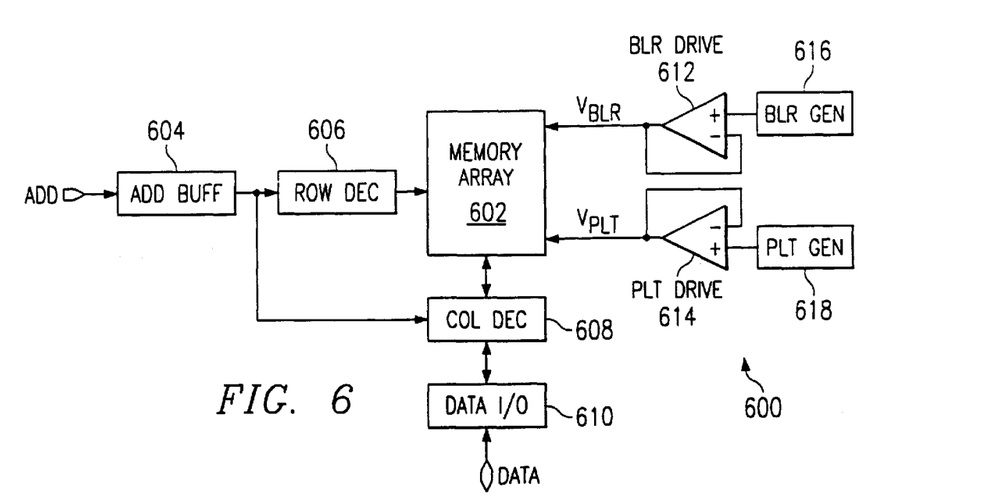
FIG. 6 is a block schematic diagram illustrating a DRAM having an input buffer, a plate reference voltage circuit, and a bit line reference voltage circuit.

Referring now to FIG. 6, a DRAM is set forth in a block diagram that may employ the preferred embodiment amplifier. The DRAM is designated by the general reference character 600 and shown to include a memory array 602 having a plurality of DRAM memory cells, an address buffer 604 that receives an externally applied address signal (ADD). A row decoder 606 and a column decoder 608 receive internal address signals from the address buffer 604, and provide access to the memory array 602. A data input/output (I/O) circuit 610 provides access for the reading of data from, or the writing of data into, the memory array 602 by way of the column decoder 608. In addition, the DRAM 600 includes a bit line reference driver circuit 612 and a plate driver circuit 614, which provide a bit line reference voltage (Vblr) and plate voltage (Vplt) to the memory array 602. The bit line reference driver 612 may be the preferred embodiment amplifier having an output node and second input node coupled to the memory array 602. The first input node of the bit line reference driver 612 receives a reference voltage from a bit line voltage reference circuit 616. The plate driver circuit 614 may also be the preferred embodiment amplifier having an output node and a second input node coupled to the memory array 602. The first input node of the bit plate driver 614 receives a plate reference voltage from a plate voltage reference circuit 618.

In operation, due to load changes caused by the operation of the DRAM 600, the output voltage of the bit line reference driver 612 may fall below a predetermined reference voltage. The bit line reference driver 612 will operate as described above to drive the output node until it returns to the correct bit line reference voltage (Vblr). The plate driver 614 operates in a similar manner. In the event the output of the plate driver 614 varies from a plate reference voltage (Vplt), the plate driver 614 will compensate for the variation, and drive the output back to the plate reference voltage, Vplt.

Figures 7, 8:
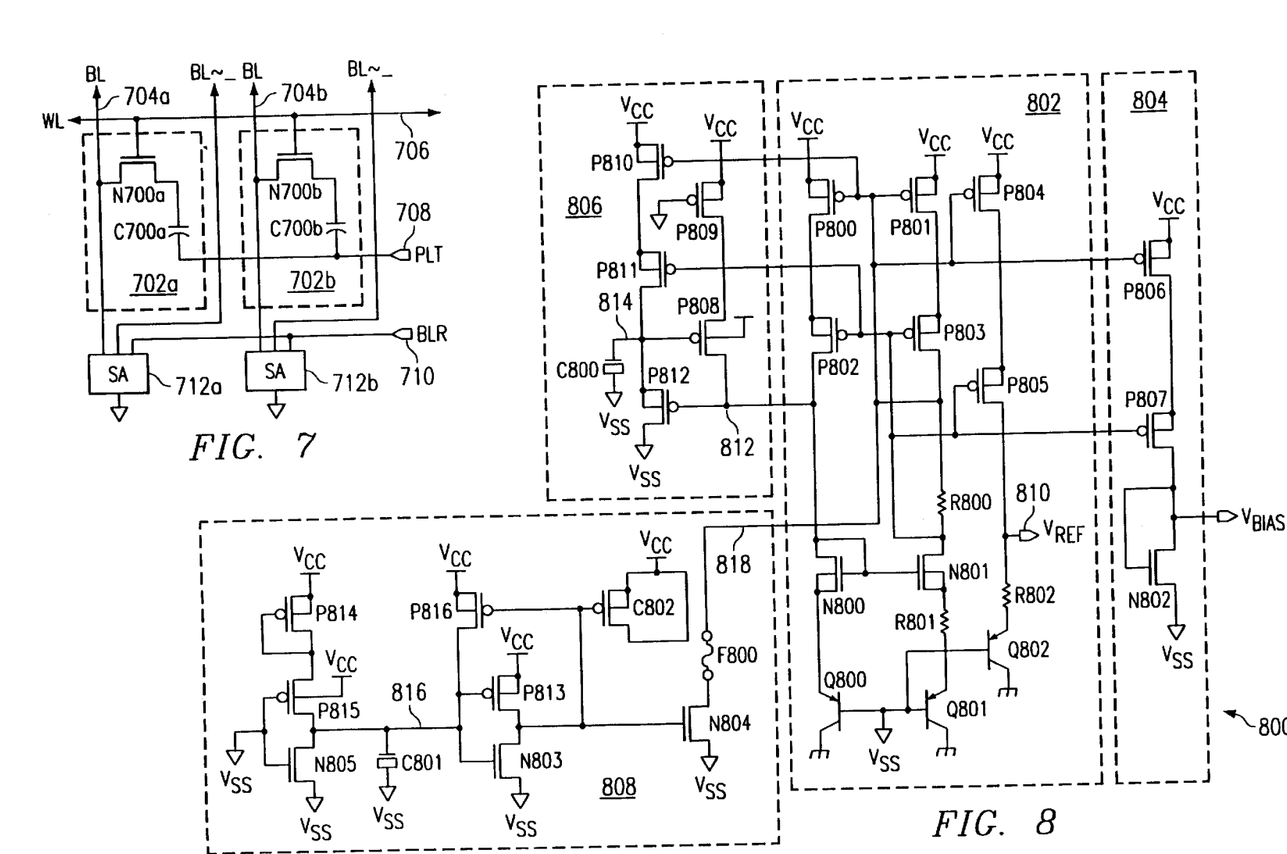
FIG. 7 is a block schematic diagram illustrating a bit line reference node and a plate reference node in a DRAM array.
FIG. 8 is a schematic diagram of a bias voltage generator according to a preferred embodiment.

Referring now to FIG. 7, a schematic diagram is set forth illustrating the connection of the plate driver 614 and the bit line reference driver 612 to the memory array 602. A portion of the memory array 602 is shown to include memory cells 702a and 702b, bit lines 704a and 704b, and word line 706. The memory cells (702a and 702b) each include an access transistor (N700a and N700b) and storage capacitor (C700a and C700b). The gates of the access transistors (N700a and N700b) are commonly coupled to the word line 706, the drains are each coupled to the bit lines (704a and 704b), and the sources are each coupled to one plate of the storage capacitors (C700a and C700b). The other plates of the storage capacitors (C700a and C700b) are commonly coupled to a plate node 708. The plate node 708 may be driven by a plate driver 614, which, as noted above, may be an amplifier according to the preferred embodiment. The bit lines (704a and 704b) are each coupled as one input to a sense amplifier (712a and 712b). The other input to the sense amplifiers (712a and 712b) is a bit line reference node 710. The bit line reference node 710 may be driven by a bit line reference driver 612 that is an amplifier according to the preferred embodiment.

Referring now to FIG. 8, a reference voltage generator is set forth in a schematic diagram. The reference voltage generator is designated by the general reference character 800, and may be used to generate the bias voltage Vbias that is applied to the gates of transistors N403 and N405 in the circuit set forth in FIG. 4. The reference voltage generator 800 is shown to includes a reference stage 802, a load stage 804, a first start-up circuit 806 and a second start-up circuit 808. The reference stage 802 includes a first pair of p-channel transistors, P800 and P801, a second pair of p-channel transistors, P802 and P803, and a pair of n-channel transistors N800 and N801. These three pairs of transistors function as a current mirror to provide a current between a first current leg, which includes the source-drain paths of transistors P800, P802 and N800, and a second current leg. which includes the source-drain paths of transistors P801, P803 and N801. The drains of transistors P800 and P801 are coupled to the sources of transistors P802 and P803. The drain of transistor P802 is coupled to the drain of transistor N800.

The reference stage 802 further includes a resistor R800, a resistor R801, and two pnp bipolar transistors, Q800 and Q801. The resistor R800 is coupled between the drain of transistor P803 and the drain of transistor N801. Transistor Q800 has an emitter coupled to the source of transistor N800, a base coupled to the low power supply Vss, and a collector coupled to the substrate. Resistor R801 is coupled between the source of transistor N801 and the emitter of transistor Q801. The base of transistor Q801 is coupled to the low power supply Vss, and the collector is coupled to the substrate. Transistors Q800 and Q801 function as diodes.

The resistance values of resistors R800 and R801, and the relative size of the cross sectional areas of the diodes created by Q800 and Q801 establish the value of the current flowing through the second current leg.

The reference stage 802 includes a third leg, which includes the series connection of p-channel transistors P804 and P805, resistor R802 and pnp bipolar transistor Q802. Transistor P804 has a gate coupled to the gate of transistor P801, transistor P805 has a gate coupled to the gate of transistor P803, and transistor Q802 has a base connected to the low power supply Vss. Due to the gate voltages of transistors P804 and P805, the current of the third leg mirrors the current in the second leg. The current flowing through the third leg gives rise to a voltage drop across resistor R802. This in, conjunction with the base-emitter voltage drop of Q802, can be used to establish a reference voltage (Vref) at a first reference node 810. The reference voltage may be used by other circuits in a memory device.

In a similar fashion to the third leg of the reference stage 802, the load stage 804 mirrors the current drawn in the second leg of the reference stage 802 to develop a bias voltage (Vbias). The load stage 804 includes two p-channel transistors, P806 and P807, connected in series with an n-channel transistor N802. The gate of transistor P806 is coupled to the gate of transistor P804, and the gate of transistor P807 is coupled to the gate of transistor P805.

Transistors P806 and P807 are biased in the same fashion as transistors P804 and P805. Transistor N802 acts as an active load to establish the Vbias voltage. The Vbias voltage may be used to establish the quiescent biasing for the novel class AB amplifier of the present invention.

The first and second start-up circuits (806 and 808) allow the reference stage 802 to ramp up with the power supply when the memory device is powered-up. The first start-up circuit 806 is shown to include starter transistors, P808 and P809, arranged in series between the high power supply Vcc and a starter node 812. The gate of transistor P809 is coupled to the low power supply Vss, and the gate of transistor P808 is coupled to a power-up node 814. Two disable transistors P810 and P811 are coupled in series between the power-up node 814 and the supply voltage Vcc. A charge capacitor C800 and third starter transistor P812 are coupled between the power-up node 814 and the supply voltage Vss.

As the device powers-up, the voltage at the starter node 812 is not sufficient to turn on transistors N800 and N801. The reference stage 802 therefore, cannot provide a reference voltage that follows a ramping power supply voltage. The first start-up circuit 806 pulls the starter node 812 high, bringing the voltage at starter node 812 more than one threshold voltage Vtn above the sources of transistors N800 and N801 as the power supply ramps up. Initially, the power-up node 814 is low, and transistors P808 and P809 will turn on, pulling the starter node 812 high. As the high power supply voltage rises, capacitor C800 charges, turning off transistor P808, which disables transistor P809.

The second start-up circuit 808 performs a similar function as the first start-up circuit 806, enabling the p-channel devices (P800 and P801) of the reference stage 802 on power-up. As in the case of transistors N800 and N801, transistors P800 and P801 will not initially be enabled as the power supply must rise to a considerable voltage before their gates will be more than one threshold voltage (Vtp) below their respective sources. The second start-up circuit 808 helps pull the gates of P800 and P801 low on power-up. Initially, capacitor C801 is discharged, and node 816 is low. With node 816 low, the CMOS inverter P813/N803 will pull the gate of transistor N804 high, as the power supply voltage rises. Transistor N804 discharges a discharge node 818 to the supply voltage Vss. With node 818 being discharged, the gates of transistors P800 and P801 are pulled one threshold voltage (Vtp) below their respective sources as the power supply ramps up.

As the device powers up, diode connected transistor P814 turns on, and CMOS inverter P815/N805 is enabled. Because the common gates of inverter devices P815/N805 are tied to the supply Vss, node 816 will be pulled high, charging capacitor C801. With node 816 high, the gate of transistor N804 is pulled low, and transistor N804 is turned off. P-channel transistor P816 and capacitor C802 help latch and maintain the gate of N804 at the low power supply voltage. A fusible link F800 is provided to disable the second start-up circuit 808.

While the preferred embodiment has been described in connection with BLR and a plate driver applications, it is understood that the preferred embodiment may be used in a variety of other applications. Just a few of the alternate applications include other supply voltages utilized in semiconductor memory devices. For example it is known to use different powers supplies for the array portion and the peripheral portion of a memory device. These power supplies may need to have active and stand-by current requirements. The preferred embodiment may be used as a "one-circuit" solution to such applications, as it can provide relatively high current for an active mode, and a low quiescent current for a stand-by node. Reference voltage generators, such as that set forth in FIG. 8 may be used to provide reference voltages for such applications.

It is also noted that the preferred embodiment output driver drives its output node in response to relatively small variations in the differential potential between the two input nodes. One skilled in the art would recognize that the sensitivity of the input stage could be altered to require the first input node to exceed the second input node by a predetermined voltage before the output driver responds. Similarly, the input stage could be altered so that the second input node would need to exceed the voltage at the first node by a second predetermined voltage before the output driver would respond.

Accordingly, although the present invention has been described in detail, it should be understood that various changes, substitutions, and alterations could be made without departing from the spirit and scope of the invention as defined by the appended claims.

What is claimed is:

1. An amplifier circuit for use in a semiconductor device, the amplifier circuit comprising:
   a first input node;
   a second input node;
   an output node;
   an input stage having
      a charge current path that includes a first charge device and a second charge device, the first charge device decreasing the impedance in the charge current path in response to an increase in voltage at the first input node, the second charge device decreasing the impedance in the charge current path in response to a decrease in voltage at the second input node, and
      a discharge current path that includes a first discharge device and a second discharge device, the first discharge device decreasing the impedance in the discharge current path in response to an increase in voltage at the second input node, the second discharge device decreasing the impedance in the discharge current path in response to a decrease in voltage at the first input node;
   a first driver circuit coupled to the charge current path, the first driver circuit driving a charge node to a charge voltage in response to increases in current within the charge current path; and
   a second driver circuit coupled to the charge current path, the second driver circuit driving a discharge node toward the charge voltage in response to increases in the amount of current within the charge current path.

2. The amplifier of claim 1, further including:
   an output driver circuit for coupling the output node to a first drive voltage in response to a charge voltage at a charge node, and for coupling the output node to a second drive voltage in response to a discharge voltage at a discharge node.

3. The amplifier of claim 1, wherein:
   the first driver circuit includes a first current mirror having an input reference terminal coupled to the charge current path, and an output terminal coupled to the charge node.

4. The amplifier of claim 1, wherein:
   the second driver circuit includes
      a current mirror having an input terminal and an output terminal, the input terminal being coupled to the charge current path, a charge load device coupled to the output of the second current mirror, the charge load device generating a discharge disable potential in response to increased current at the input terminal of the second current mirror, and a discharge disable driver device, for driving the discharge node to a charge voltage in response to the discharge disable potential being generated by the first load device.

5. The amplifier of claim 1, including:

a third driver circuit coupled to the discharge current path, the third driver circuit driving the discharge node to a discharge voltage in response to increases in current within the discharge current path; and a fourth driver circuit coupled to the discharge current path, the fourth driver circuit driving a charge node toward the discharge voltage in response to increases in the current within the discharge current path.

6. The amplifier of claim 5, wherein:

the third driver circuit includes a current mirror having an input terminal coupled to the discharge current path, and an output terminal coupled to the discharge node.

7. The amplifier of claim 5, wherein:

the fourth driver circuit includes a current mirror having an input terminal and an output terminal, the input terminal being coupled to the discharge current path, a discharge load device coupled to the output of the fourth current mirror, the discharge load device generating a charge disable potential in response to increased current at the input terminal of the fourth current mirror, and a charge disable driver device, for driving the charge node to a discharge voltage in response to the charge disable potential being-generated by the discharge load device.

8. The amplifier of claim 2, wherein:

the output driver circuit includes a pull-up device for coupling the output node to the first power supply voltage in response to a charge voltage at the charge node, and for providing a high impedance path between the output node and the first power supply voltage in response to a discharge voltage at the charge node, and a pull-down device for driving the output node to the second power supply voltage in response to a discharge voltage at the discharge node, and for providing a high impedance path between the output node and the second power supply voltage in response to a charge voltage at the discharge node.

9. The amplifier of claim 1, wherein:

the output node is coupled to the second input.

10. The amplifier of claim 1, wherein:

an input stage further includes a first level shift circuit coupled between the first input node and the second discharge device, and a second level shift circuit coupled between the second input node and the second charge device.

11. The amplifier of claim 1, wherein:

the first level shift circuit includes a first bias circuit for establishing a bias current in the discharge current path when the amplifier is in a quiescent state; and the second level shift circuit includes a second bias circuit for establishing a bias current in the charge current path when the amplifier is in a quiescent state.

12. An improved class AB amplifier, comprising:

a first input node for receiving a first input signal;

a second input node for receiving a second input signal;

a push-pull input stage having a first current leg, a second current leg, a third current leg, and a fourth current leg, the push-pull input stage increasing the impedance between the second current leg and the third current leg when a second input signal is lower in potential than the first input signal, and increasing the impedance between the first current leg and the fourth current leg when the first input signal is lower in potential than the second input signal;

a first current mirror coupled to a first power supply voltage, and having an input coupled to the second leg of the push-pull input stage, and an output coupled to a discharge node;

a second current mirror coupled to a second power supply voltage, and having an input coupled to the fourth leg of the push-pull input stage, and an output coupled to a charge node; and an output driver having a pull-up circuit having a charging impedance path coupled between an output node and the first power supply voltage, the impedance of the charging impedance path being controlled by the potential at the charge node, and a pull-down circuit having a discharging impedance path coupled between the output node and the second power supply voltage, the impedance of the discharging impedance path being controlled by the potential at the discharge node.

13. The class AB amplifier of claim 12, wherein:

the push-pull input stage includes a charge current path coupled between the first and fourth current legs, the charge current path having a first impedance control device coupled in series with a second impedance control device, the first impedance control device being coupled to the first input node, and a discharge current path coupled between the second and third current legs, the discharge current path having a third impedance control device coupled in series with a fourth impedance control device, the third impedance control device being coupled to the second input node.

14. The class AB amplifier of claim 13, wherein:

the first impedance control device and third impedance control device are first and second insulated gate field effect transistors (IGFETs), respectively, the gate of the first IGFET being coupled to the first input node, the gate of the second IGFET being coupled to the second input node.

15. The class AB amplifier of claim 13, wherein:

the first and third impedance control devices are IGFETs of a first conductivity type, and the second and fourth impedance control devices are IGFETs of a second conductivity type.

16. The class AB amplifier of claim 13, wherein:

the first current mirror includes a first reference IGFET and a first output IGFET of a second conductivity type, the first reference IGFET having its source coupled to the first power supply voltage, its drain coupled to the second current leg of the push-pull input stage, and its gate coupled to its drain, the first output IGFET having its source coupled to the first power supply voltage, its drain coupled to the discharge node, and its gate coupled to the gate of the first reference IGFET; and the second current mirror includes a second reference IGEET and a second output IGFET of a first conductivity type, the second reference IGFET having its source coupled to the second power supply voltage, its drain coupled to the fourth current leg of the push-pull input stage, and its gate coupled to its drain, the second output IGFET having its source coupled to the second power supply voltage, its drain coupled to the charge node, and its gate coupled to the gate of the second reference IGFET.

17. The class AB amplifier of claim 13, further including:

a first level shifter circuit coupled to the first input node, the output of the first level shifter being coupled to the fourth impedance control device of the push-pull input stage; and a second level shifter circuit coupled to the second input node, the output of the second level shifter being coupled to the second impedance control device of the push-pull input stage.

18. An improved class AB amplifier, comprising:

a first input node for receiving a first input signal;

a second input node for receiving a second input signal;

a push-pull input stage having a first current leg, a second current leg, a third current leg, and a fourth current leg, the push-pull input stage increasing the impedance between the second current leg and the third current leg when a second input signal is lower in potential than the first input signal, and increasing the impedance between the first current leg and the fourth current leg when the first input signal is lower in potential than the second input signal;

a first current mirror coupled to a first power supply voltage and having an input coupled to the second leg of the push-pull input stage, and an output coupled to a discharge node;

a second current mirror coupled to a second power supply voltage, and having an input coupled to the fourth leg of the push-pull input stage, and an output coupled to a charge node; and a discharge driver circuit coupled to the discharge node, the discharge driver circuit providing a low impedance path between the discharge node and the second power supply voltage in response to the potential at a discharge control node.

19. The class AB amplifier of claim 18, further including:

a third current mirror coupled to a first power supply voltage, and having an input coupled to the first leg of the push-pull input stage, and an output coupled to the discharge control node.

20. The class AB amplifier of claim 19, wherein:

the discharge driver circuit includes a driver IGFET of a first conductivity type; and the third current mirror includes a reference IGFET and output IGFET of a second conductivity type.

21. An improved class AB amplifier, comprising:

a first input node for receiving a first input signal;

a second input node for receiving a second input signal;

a push-pull input stage having a first current leg, a second current leg, a third current leg, and a fourth current leg, the push-pull input stage increasing the impedance between the second current leg and the third current leg when a second input signal is lower in potential than the first input signal, and increasing the impedance between the first current leg and the fourth current leg when the first input signal is lower in potential than the second input signal;

a first current mirror coupled to a first power supply voltage, and having an input coupled to the second leg of the push-pull input stage, and an output coupled to a discharge node;

a second current mirror coupled to a second power supply voltage, and having an input coupled to the fourth leg of the push-pull input stage, and an output coupled to a charge node; and a charge driver circuit coupled to the charge node, the charge driver circuit providing a low impedance path between the charge node and the first power supply voltage in response to the potential at a charge control node.

22. The class AB amplifier of claim 21, further including:

a third current mirror coupled to a second power supply voltage, and having an input coupled to the third leg of the push-pull input stage, and an output coupled to the charge control node.

23. The class AB amplifier of claim 22, wherein:

the charge driver circuit indcludes a driver IGFET of a second conductivity type; and the third current mirror includes a reference IGFET and output IGFET of a first conductivity type.

24. The class AB amplifier of claim 22, further including:

a fourth current mirror coupled to a first power supply voltage, and having an input coupled to the first leg of the push-pull input stage, and an output coupled to the discharge control node.

* * * * *